(12) United States Patent
Shiv (10) Patent No.: US 7,662,710 B2
(45) Date of Patent: Feb. 16, 2010

(54) FORMATION OF THROUGH-WAFER ELECTRICAL INTERCONNECTIONS AND OTHER STRUCTURES USING A THIN DIELECTRIC MEMBRANE

(75) Inventor: Lior Shiv, Hilleroed (DK)

(73) Assignee: Hymite A/S, Alleroed (DK)

( * ) Notice: Subject to any disclaimer, the term of this patent is extended or adjusted under 35 U.S.C. 154(b) by 0 days.

(21) Appl. No.: 12/418,923

(22) Filed: Apr. 6, 2009

(65) Prior Publication Data

US 2009/0191704 A1    Jul. 30, 2009

Related U.S. Application Data

(62) Division of application No. 11/669,664, filed on Jan. 31, 2007, now Pat. No. 7,531,445.

(60) Provisional application No. 60/848,043, filed on Sep. 26, 2006.

(51) Int. Cl.
*H01L 21/4763* (2006.01)

(52) U.S. Cl. .................. 438/620; 257/E21.575

(58) Field of Classification Search .............. 438/620, 438/624, 667, 672, 673; 257/E21.575, E21.597
See application file for complete search history.

(56) References Cited

U.S. PATENT DOCUMENTS

| 4,200,472 | A  | * | 4/1980  | Chappell et al. ............ 136/246 |
| 4,765,864 | A  |   | 8/1988  | Holland et al. |
| 5,446,308 | A  | * | 8/1995  | Piccone et al. .............. 257/438 |
| 6,818,464 | B2 |   | 11/2004 | Heschel |
| 6,853,046 | B2 |   | 2/2005  | Shibayama |
| 2003/0215194 | A1 |   | 11/2003 | Kuhmann et al. |
| 2006/0131691 | A1 |   | 6/2006  | Roozeboom et al. |

FOREIGN PATENT DOCUMENTS

GB    2 150 749 A    7/1985

* cited by examiner

*Primary Examiner*—Brook Kebede
(74) *Attorney, Agent, or Firm*—Fish & Richardson P.C.

(57) ABSTRACT

Providing through-wafer interconnections in a semiconductor wafer includes forming a sacrificial membrane in a pre-existing semiconductor wafer, depositing metallization over one side of the wafer so as to cover exposed portions of the sacrificial membrane facing the one side of the wafer, removing exposed portions of the sacrificial membrane facing the other side of the wafer, and depositing metallization over the other side of the wafer so as to contact the previously deposited metallization. Techniques also are disclosed for providing capacitive and other structures using thin metal membranes.

11 Claims, 13 Drawing Sheets

FORMATION OF THROUGH-WAFER ELECTRICAL INTERCONNECTIONS AND OTHER STRUCTURES USING A THIN DIELECTRIC MEMBRANE

CROSS-REFERENCE TO RELATED APPLICATIONS

This is a divisional application of U.S. patent application Ser. No. 11/669,664, filed on Jan. 31, 2007, which in turn claims the benefit of priority of U.S. Provisional Patent Application Ser. No. 60/848,043, filed on Sep. 26, 2006.

TECHNICAL FIELD

This disclosure relates to techniques for forming through-wafer electrical interconnections and other structures using a thin dielectric membrane.

BACKGROUND

U.S. Pat. No. 6,818,464, assigned to the assignee of this application, discloses a double-sided etching technique for providing a semiconductor structure with one or more through-holes that are sealed hermetically by a feed-through metallization process. The feed-through metallization process may include using an electroplating technique. The semiconductor structure can be used, for example, as a lid for a package that encapsulates an opto-electronic or other device or an integrated circuit. The through-wafer electrical interconnections may provide electrical contact, for example, from outside the package to the device or circuit encapsulated within the package.

According to a particular embodiment disclosed in the foregoing patent, the double-sided etching technique is performed on a silicon wafer that includes a buried etch-stop layer. Although the through-wafer electrical interconnections can be obtained satisfactorily, inclusion of a buried etch-stop layer in the semiconductor wafer can be expensive. Likewise, use of electroplating techniques to form the feed-through metallization can be expensive.

The present invention can obviate the need for such a buried etch-stop layer and does not require use of electroplating techniques to form the feed-through metallization.

SUMMARY

According to an aspect of the present invention, fabrication of through-wafer interconnections include formation of a sacrificial membrane.

For example, one method of providing through-wafer interconnections in a semiconductor wafer includes forming a sacrificial membrane in a pre-existing semiconductor wafer, depositing metallization over one side of the wafer so as to cover exposed portions of the sacrificial membrane facing the one side of the wafer, removing exposed portions of the sacrificial membrane facing the other side of the wafer, and depositing metallization over said other side of the wafer so as to contact the previously deposited metallization.

In some implementations, the sacrificial membrane is silicon dioxide or silicon nitride.

In another aspect, a method is disclosed for providing through-wafer interconnections in a semiconductor wafer that includes first and second sides. The method includes etching one or more micro-vias in the second side of the wafer and providing an etch stop layer over the second side, wherein the etch stop layer covers surfaces in the micro-vias. A cavity is etched in the first side of the wafer to a depth such that portions of the etch stop layer, in areas where the micro-vias were etched, are exposed in the cavity. The method includes depositing metallization over one side of the wafer and subsequently removing regions of the etch stop layer from areas corresponding to where the micro-vias were etched. Metallization is deposited over the other side of the wafer so that the metallization deposited over the first side is in contact with the metallization deposited over the second side to form the through-wafer interconnections in areas corresponding to where the micro-vias were etched.

In other implementations, the cavity can be etched in the first side of the wafer before etching the micro-vias in the second side. Thus, for example, a method for providing through-wafer interconnections in a semiconductor wafer, which has first and second sides, can include etching a cavity in the first side of the wafer, providing an etch stop layer over the first side of the wafer, wherein the etch stop layer covers surfaces in the cavity, and etching one or more micro-vias in the second side of the wafer to a depth such that the one or more micro-vias reach the etch stop layer. Metallization can be deposited over one side of the wafer and, subsequently, regions of the etch stop layer can be removed from areas corresponding to where the one or more micro-vias were etched. Metallization can be deposited over the other side of the wafer so that the metallization deposited over the first side is in contact with the metallization deposited over the second side to form the through-wafer interconnections in areas corresponding to where the one or more micro-vias were etched.

Although the foregoing techniques use double-sided etching (i.e., etching from one side to form micro-vias and etching from the other side to form a cavity), in some implementations, through-wafer openings can be etched from only one side of the wafer.

In some cases, the techniques may result in hermetically sealed through-wafer interconnections.

The thin metal membrane also can be used to form capacitive and other structures, such as thin membrane inductors and cantilever structures.

Other features and advantages will be apparent from the following detailed description, the accompanying drawings and the claims.

DETAILED DESCRIPTION

Figure 1A:
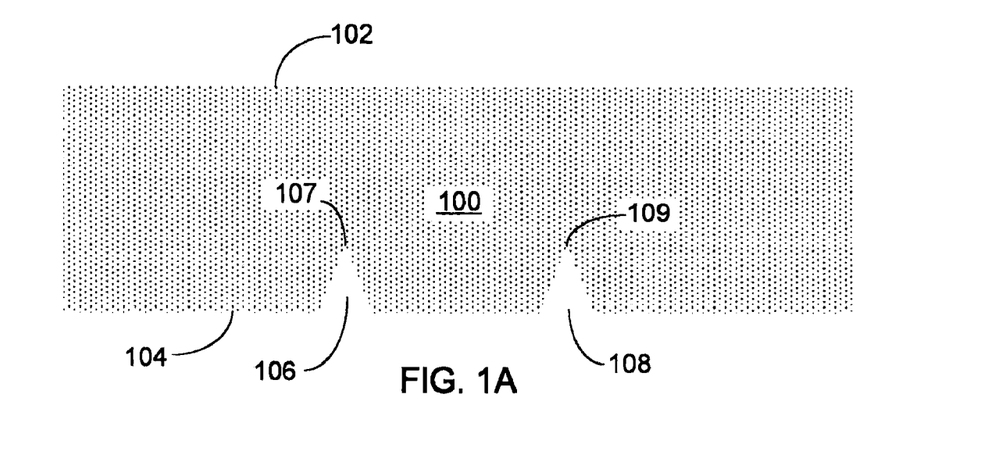
FIG. 1A through 1F illustrate an implementation of a double-sided etch process for forming through-wafer interconnections using a thin sacrificial dielectric membrane.

Implementations are disclosed that include double-sided and single-sided etching techniques performed on a semiconductor wafer to define openings where through-wafer metallization can occur. FIG. 1A through 1F illustrate an example of an implementation for a through-wafer interconnect process using a double-sided etching technique where vias are etched in a semiconductor wafer 100 prior to etching cavities. In FIG. 1A, semiconductor wafer 100 includes a first side 102 and a second side 104. Micro-vias 106, 108, with bottoms 107, 109, respectively, can be etched on the second side 104 of the semiconductor wafer 100 to a pre-defined depth. For example, the semiconductor wafer 100 can be a silicon (Si) wafer that can be anisotropically etched in potassium hydroxide (KOH).

FIG. 1A illustrates two pyramid shaped micro-vias 106, 108. However, micro-vias can be formed in a side of a semiconductor wafer in different shapes, for example, squares or rectangles. Also, the number of micro-vias is not limited to two; one or more than two micro-vias may be etched. The number of micro-vias and their shape can be determined, for example, based on semiconductor size and processing conditions as well as circuit connectivity requirements.

Figure 1B:
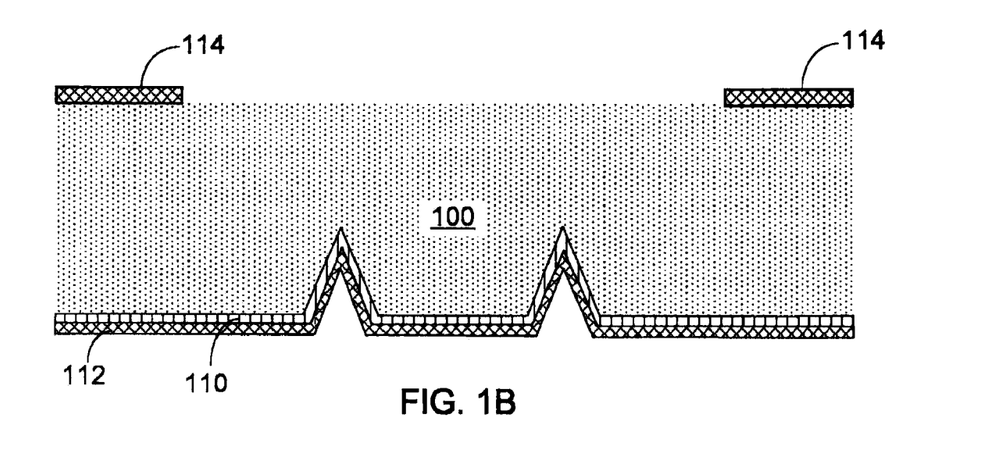

Next, in FIG. 1B, an etch stop layer 110 is deposited on the etched second side 104 of the semiconductor wafer 100. The etch stop layer 110 may be composes, for example, of silicon dioxide ($SiO_2$) and/or silicon nitride ($Si_3N_4$). A silicon dioxide layer can be grown, for example, using a thermal oxidation process. If a thermal oxidation process is used, then the etch stop layer material may cover both sides of the wafer. The silicon dioxide layer also can serve as an isolation or passivation layer for the semiconductor wafer 100.

An etch mask layer 112 is deposited on the second side 104 of the semiconductor wafer 100 over the etch stop layer 110. The etch mask layer 112 can also be comprised of, for example, silicon dioxide and/or silicon nitride. The same layer composition is not necessarily used for the etch stop layer 110 as is used for the etch mask layer 112. For example, the etch mask layer 112 can be composed of silicon nitride that is deposited using a low-pressure-chemical-vapor-deposition (LPCVD) process.

Also, as shown in FIG. 1B, an etch mask layer 114 is deposited on the first side 102 of the semiconductor wafer 100. The etch mask layer 114 defines openings for one or more cavities that subsequently are formed in the first side 102 of the wafer.

Figure 1C:
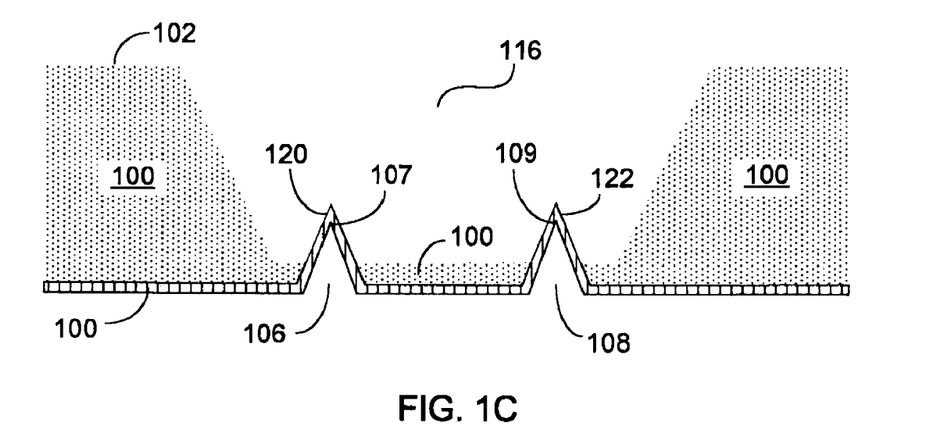

Next, the one or more cavities (e.g., cavity 116) are defined and etched from the first side 102 of the semiconductor wafer 100, as illustrated in FIG. 1C. The etch technique used to form the cavity 116 may be the same technique as was used to form the micro-vias 106, 108. Cavity 116 can be etched to a pre-defined depth so that thin membranes 120, 122 remain in the areas defined by the micro-vias 106, 108, respectively. The thin membranes 120, 122 are formed by the material of the etch stop layer 110. In this example, the etched cavity 116 is larger than the micro-vias 106 and 108.

In the implementation shown in FIG. 1C, the sum of the etch depths for the cavity 116 and each of the micro-vias 106, 108 exceeds the total thickness of the semiconductor wafer so that the bottom of the cavity 116 extends beyond the bottom 107, 109 of the micro-vias 106, 108, respectively. A portion of each thin membrane 120, 122 is, therefore, exposed within the cavity 116. The etch mask layers 112, 114 then can be stripped. For example, if the etch mask layers 112, 114 are composed of silicon nitride, a reactive ion etching (RIE) process may be used to strip the layers. In some implementations, a wet etch process using phosphoric acid can be used to strip the etch mask layers.

Figure 1D:
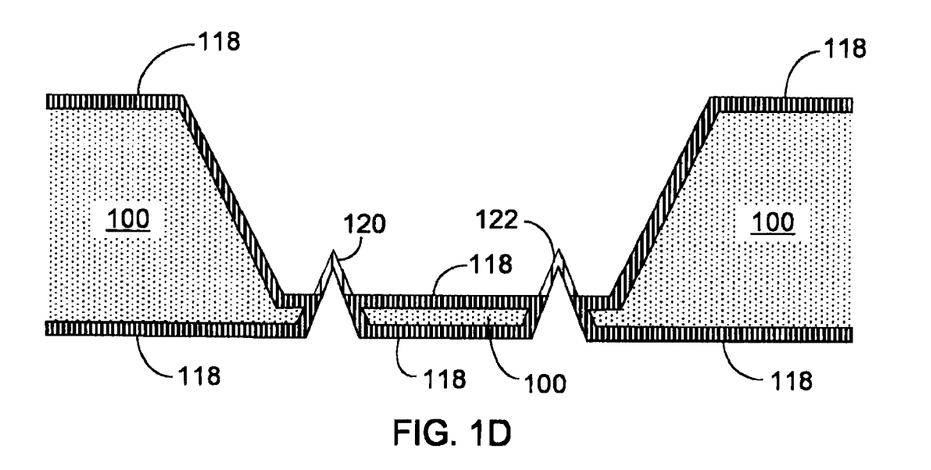

In FIG. 1D, the semiconductor wafer 100 is oxidized. In an example where the semiconductor wafer 100 is composed of silicon, the oxide layer can be grown, for example, using a thermal oxidation process. Thick regions (e.g., 1200 nm) of oxide 118 (e.g., $SiO_2$) can be formed on the silicon semiconductor wafer surface (e.g., in a region where silicon is present). Relatively thin regions (e.g., 400 nm) of oxide (e.g., $SiO_2$) remain in areas where there is no silicon. For example, thin membranes 120, 122 of the etch stop layer 110 remain in the areas previously defined by the micro-vias, 106, 108, respectively.

Figure 1E:
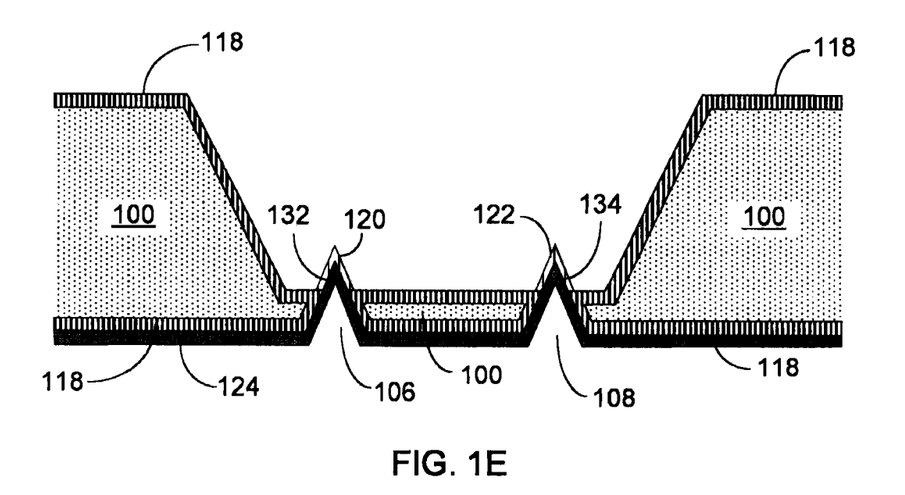

Next, as illustrated in FIG. 1E, a thin metal film 124 is deposited on the second side 104 of the semiconductor wafer 100. The metal film 124 covers the thin membranes 120, 122 to form metal membranes 132, 134, respectively. For example, a thin film of copper (e.g., 3-4 micrometers) may be deposited by a physical vapor deposition (PVD) or other process.

The portions of the thin membranes 120, 122 (i.e., etch stop material) that are exposed within the cavity 116 then can be removed. For example, a hydrofluoric acid (HF) based etchant may be used to remove those portions of the etch stop material. As the oxide 118 on the silicon 100 is thicker than the thin membranes 120, 122, the exposed portions of the thin membranes 120, 122 can be etched away, with some oxide 118 remaining over the regions of the silicon 100 to provide electrical isolation. Because of the presence of the thicker oxide over the silicon, a separate etch mask is not required during etching of the etch-stop layer membranes 120, 122.

Figure 1F:
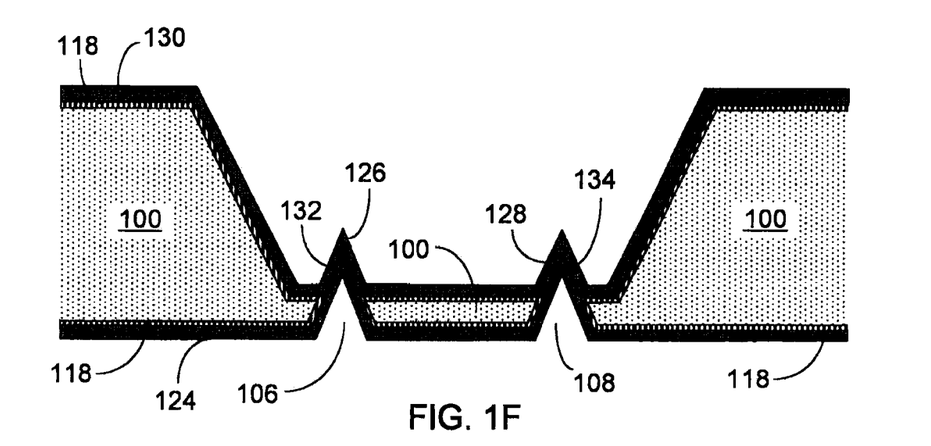

Next, as illustrated in FIG. 1F, a thin metal film 130 is deposited over the first side 102 of the wafer. The thin film 130 can be deposited directly on the exposed portions of the metal membranes 132, 134 to form electrical contact between the two sides of the semiconductor wafer 100. The first-side thin metal film 130 contacts the second-side thin metal film 124 forming the through-wafer connections 126, 128 in the areas where the micro-vias 106 and 108 previously were defined.

In an alternate implementation, a thin metal film 130 can be deposited on the first side 102 and the thin membranes 120, 122 can be removed before a thin metal film 124 is deposited on the second side 104 of the semiconductor wafer 100.

Figure 2A:
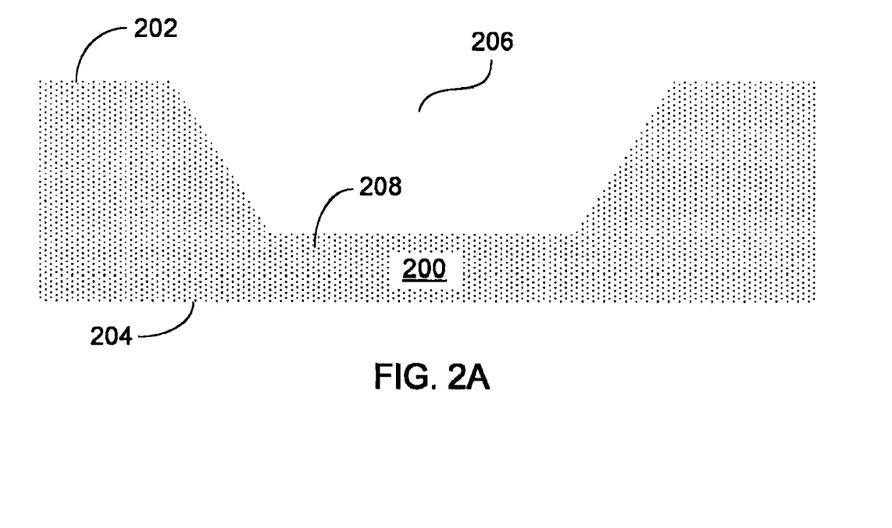
FIG. 2A through 2F illustrate another implementation of a double-sided etch process for forming through-wafer interconnections using a thin sacrificial dielectric membrane.

FIG. 2A through 2F illustrate an example of an implementation for a through-wafer interconnect process using a double-sided etching technique where cavities are etched in the semiconductor wafer 200 prior to etching micro-vias. As illustrated in FIG. 2A, semiconductor wafer 200 includes a first side 202 and a second side 204. Cavities (e.g., cavity 206) are etched from the first side 202 of the semiconductor wafer 200.

For example, the semiconductor wafer 200 may be a silicon wafer. The cavity 206 can be etched to a pre-defined depth forming a thin silicon membrane 208 (e.g., 20 μm) in the silicon wafer. Standard etch techniques can be used to form the cavity 206. For example, the cavity 206 can be etched anisotropically in potassium hydroxide.

Figure 2B:
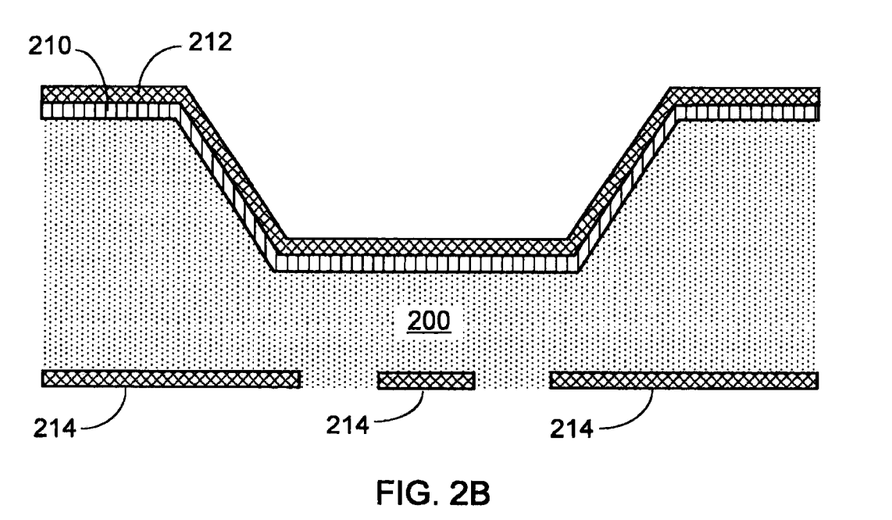

In FIG. 2B an etch stop layer 210 is deposited on the etched first side 202 of the semiconductor wafer 200. The etch stop layer 210 may be composed, for example, of a thermally grown silicon dioxide and/or silicon nitride layer. This silicon dioxide layer may also serve as a dielectric layer.

Also, as illustrated in FIG. 2B, an etch mask layer 212 can be deposited on the first side 202 of the semiconductor wafer 100 over the etch stop layer 210. The etch mask layer 212 also can be composed of silicon dioxide and/or silicon nitride, for example. The same layer composition is not necessarily used for the etch stop layer 210 as is used for the etch mask layer 212.

Next, an etch mask layer 214 may also be deposited on the second side 204. For example, a silicon nitride etch mask layer may be deposited using an LPCVD process.

Figure 2C:
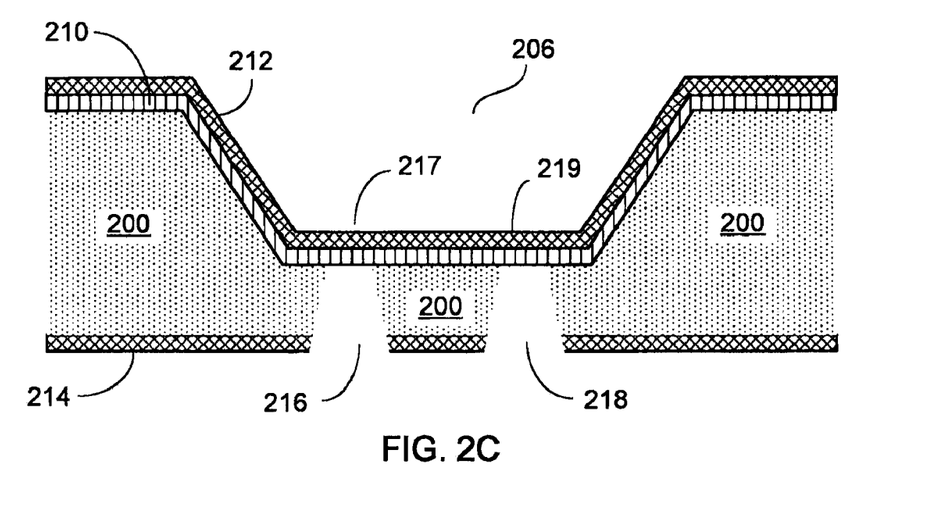

Openings can now be etched from the second side 204 of the semiconductor wafer 200 to define micro-vias. FIG. 2C illustrates micro-vias 216, 218 that are formed opposite the previously-formed larger cavity 206. The micro-vias 216, 218 can be etched to the etch stop layer 210. Thin membranes 217, 219 consisting of the etch stop layer 210 and the etch mask layer 212 remain in the areas between the cavity 206 and the micro-vias 216, 218. The etch technique used to create the micro-vias may be the same technique that is used to form the cavities.

The micro-vias may be of different shapes and varying quantities. FIG. 2C illustrates two pyramid-shaped micro-vias 216, 218. In another implementation, only one, or more than two, micro-vias may be etched and they may have a rectangular or other shape.

Figure 2D:
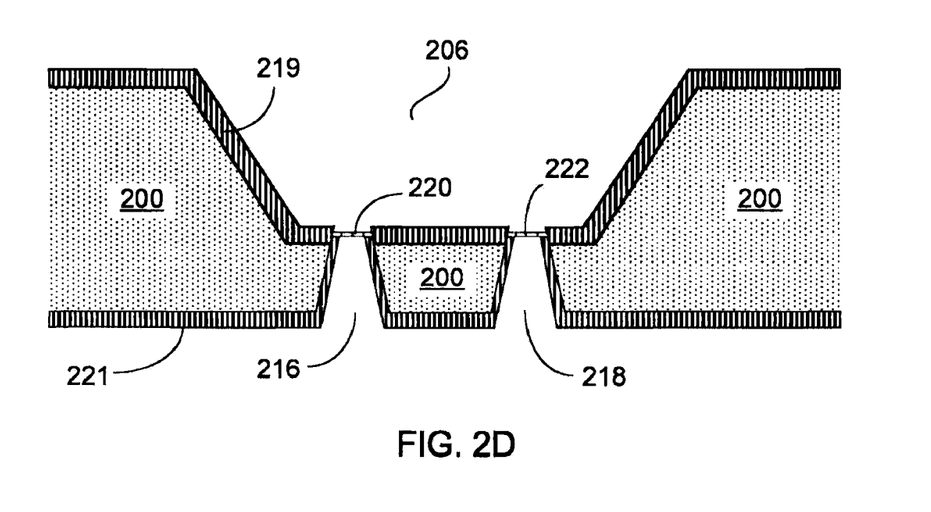

Next, as shown in FIG. 2D, the etch mask layers 212, 214 are stripped. For example, reactive ion etching (RIE) may be used to strip a silicon nitride etch mask layer. The semiconductor wafer 200 then can be oxidized in a thermal oxidation process to form relatively thick regions of oxide 219, 221 on both sides of the semiconductor wafer 200. Thin membranes 220, 222 consisting of the etch stop layer 210 remain between the cavity 206 and the micro-vias 216, 218, respectively. The oxide layers 219, 221 are grown to a thickness greater than that of the membranes 220, 222.

Figure 2E:
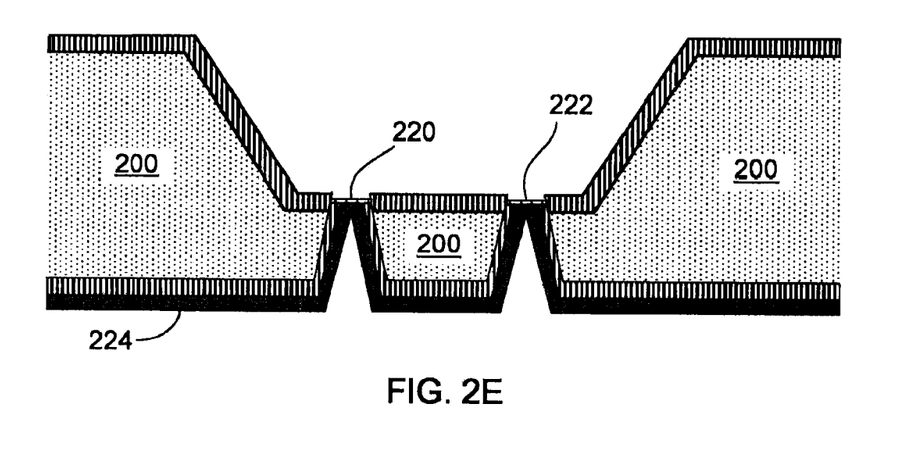

A thin metal film 224 is deposited on the second side 204 of the semiconductor wafer 200, as illustrated in FIG. 2E. The thin metal film 224 should extend along the sides of the micro-vias and should cover the thin membranes 220, 222. For example, a thin film of copper (e.g., 3-4 μm) may be deposited by a PVD or other process.

Figure 2F:
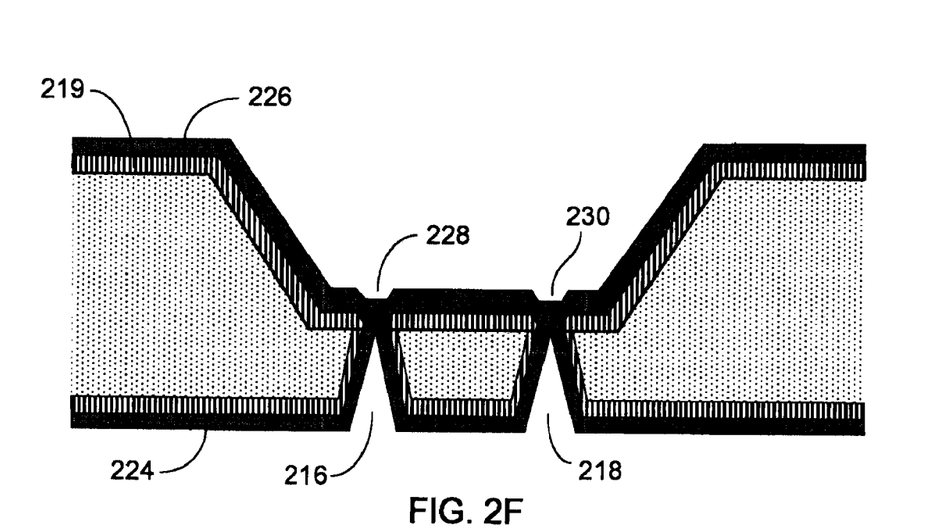
Figure 3:
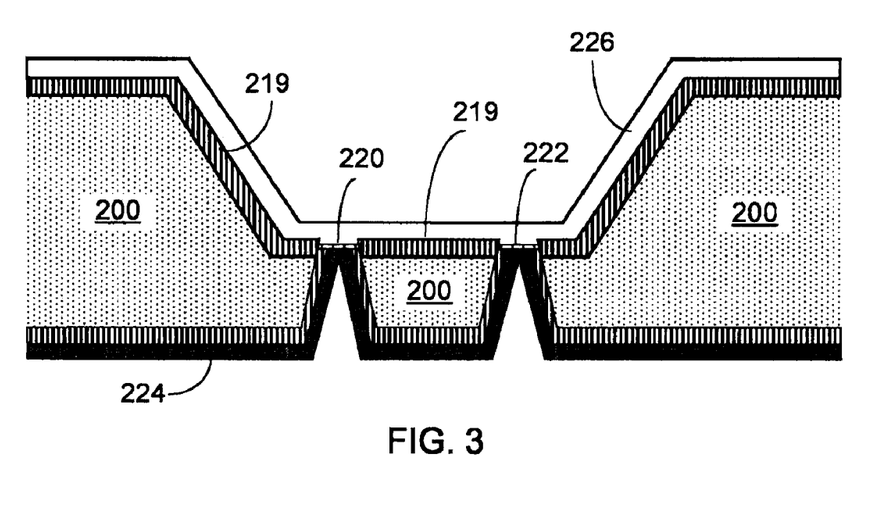
FIG. 3 illustrates an example of a double-sided etch process for forming through-wafer capacitive interconnections using a thin dielectric membrane.

As shown in FIG. 2F, the thin membranes 220, 222 (i.e., etch stop material) are removed. For example, a HF etching process may be used to remove the thin membranes 220, 222. The thicker oxide layer 219 can remain on the regions of silicon to provide electrical isolation. Because of the presence of the thicker oxide 219 over the silicon, a separate etch mask is not required during removal of the etch-stop layer membranes 220, 222.

Next, a thin metal film 226 is deposited on the first side 202. The thin film 226 can be deposited directly over the areas of the micro-vias 216, 218, respectively, to form electrical contact between the two sides of the semiconductor wafer 200. The second-side thin metal film 224 contacts the first-side thin metal film 226 to form the through-wafer connections 228, 230.

In an alternate implementation, the thin metal film 226 may be deposited on the first side of the wafer and the thin membranes 220, 222 may be removed prior to depositing the thin metal film 224 on the second side of the wafer.

Upon completion of the foregoing through-wafer metallization, metal structures may be formed on one or both sides of the semiconductor wafer by additional etch and deposition steps to provide, for example, electrical interconnects and solder pads.

Although the foregoing techniques use double-sided etching (i.e., etching from one side to form micro-vias and etching from the other side to form larger cavities), in some applications through-wafer openings can be etched from only one side of the wafer. For example, large cavities can be etched from one side (e.g., the first side) of the wafer all the way through to the second side of the wafer with an etch-stop (e.g., $SiO_2$) layer on the second side. The two metal depositions and etch-stop membrane removal can be performed as discussed above (see FIGS. 4A through 4D below).

The metal membrane can be used for other applications as well. For example, the metal membrane can be used to measure the hermeticity of a package that houses a micro component such as an optical device, electro-magnetic device, chemical device, micro-mechanical device, micro-electro-mechanical system (MEMS) device or micro-optoelectromechanical system (MOEMS) device or other device that contains tiny, micron and sub-micron-sized elements. In one example, changes in the shape of the metal membrane are sensed using an optical profilometer. The changes are used to determine the relative pressure and/or the leak rate in a sealed enclosure formed by attaching the wafer (or part of the wafer, for example, after dicing) to another substrate.

Figure 6:
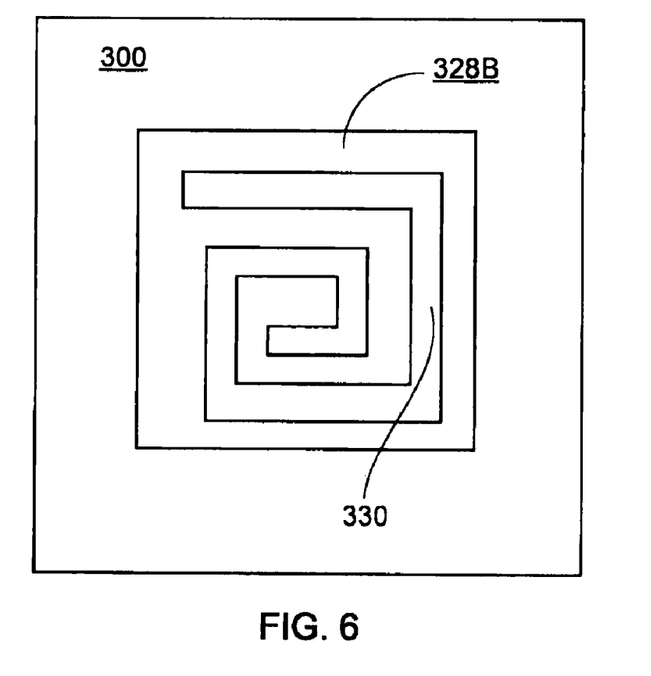
FIG. 6 illustrates a top view of an inductor according to the process of FIGS. 4A through 4E.

Additionally, although one application of the thin etch-stop layer membrane is for formation of through-wafer electrical interconnections, other applications include formation of capacitive, inductive or other structures. For example, the etch stop layer can be removed only partially (or not at all) to form a through-wafer capacitive structure. Referring back to FIG. 2E, a thin metal film 224 is illustrated as having been deposited on one side of a semiconductor wafer in which thin membranes 220, 222 of etch stop material (e.g., $SiO_2$) are formed. Instead of removing the thin membranes 220, 222 (as illustrated in FIG. 2F), the thin metal film 226 can be deposited directly on the thick oxide 219 layer and on the thin membranes 220, 222 to form a capacitive structure. Example of such through-wafer capacitive structures are illustrated in FIG. 6. The capacitive structures are composed of a thin oxide layer 220 (or 222) disposed between the pair of metal layers 224, 226 and are formed at the boundary between the large cavity 206 and the micro-vias 216, 218. Although the illustrated implementation uses a double-sided etch process (to form the large cavity and the micro-vias), a through-wafer capacitive structure also can be fabricated using a single-sided etch process.

In other implementations, a thin metal membrane, with through-wafer interconnections, can be patterned to form a device such as an inductor (e.g., coil) or movable cantilever. FIGS. 4A through 4E illustrate an example for fabricating an inductor or metal cantilever structure. The process includes formation of a thin $SiO_2$ sacrificial membrane. FIG. 5 illustrates a top view of an example of a metal cantilever structure 328A; FIG. 6 illustrates a top view of an example of an inductor 328B.

Figure 4A:
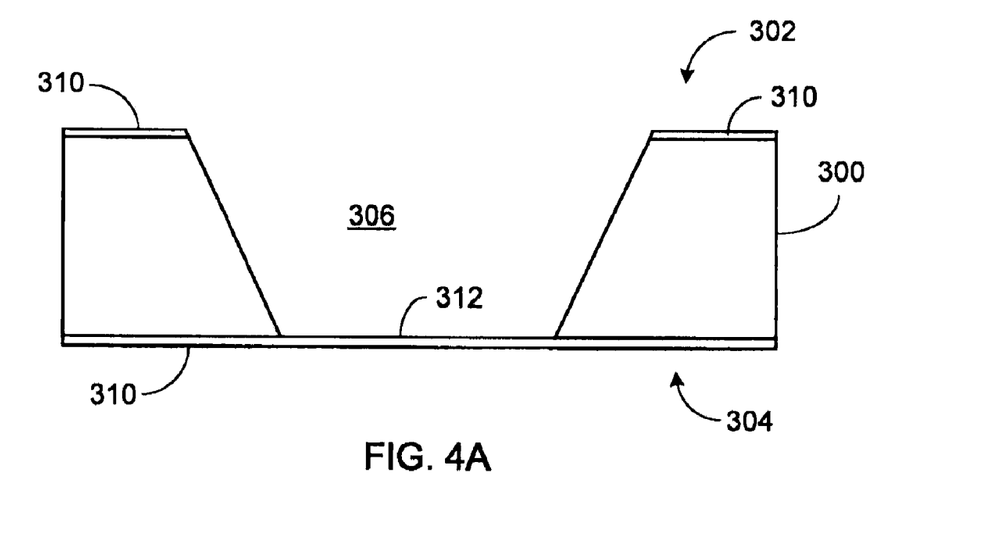
FIGS. 4A through 4E illustrate an implementation of a single-sided etch process for forming a metal cantilever structure or inductor using a thin sacrificial dielectric membrane.
Figure 5:
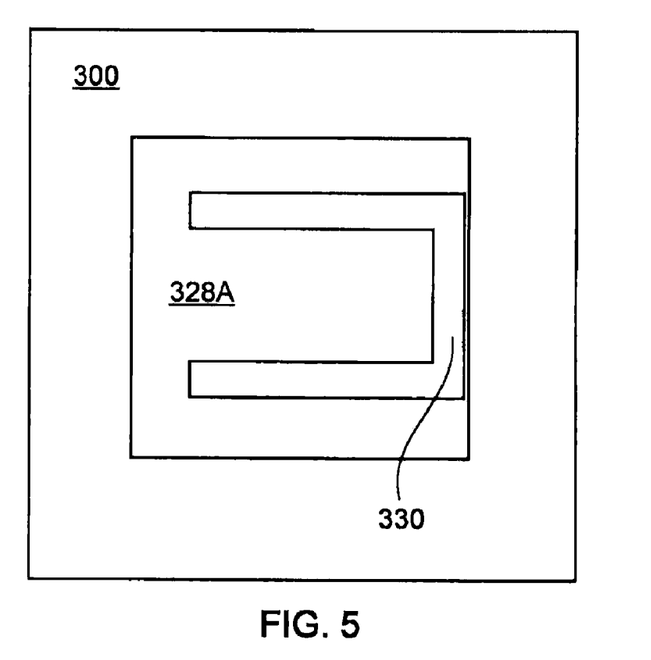
FIG. 5 illustrates a top view of a metal cantilever structure according to the process of FIGS. 4A through 4E.

As shown in FIG. 4A, a semiconductor wafer 300 includes a first side 302 and a second side 304. Etch mask and etch stop layers 310 (e.g., layers of $SiO_2$ and/or $Si_3N_4$) are deposited on both sides 302, 204 of the wafer, and a cavity 306 is etched through the wafer 300. If $Si_3N_4$ was used as the etch mask layer, it is removed. Thus, a relatively thin membrane 312 formed of the etch stop layer 310 remains on the surface of the wafer's second side 304. The thin etch stop layer membrane 312 also extends across the bottom of the cavity 306.

Figure 4B:
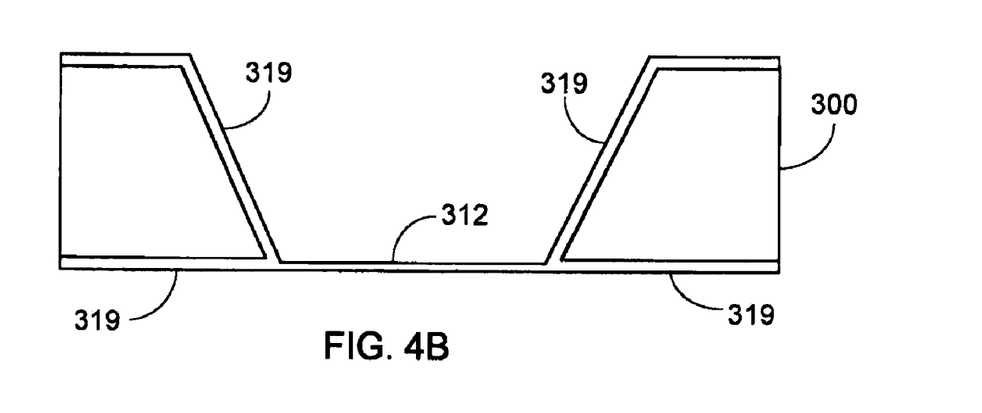

Next, as illustrated in FIG. 4B, a relatively long thermal oxidation process is performed to form thick oxide layers 319 over regions where silicon is present. The oxidation process should be sufficiently long so that the resulting oxide layers 319 are thicker than the thin membrane layer 312 extending across the bottom of the cavity 306.

Figure 4C:
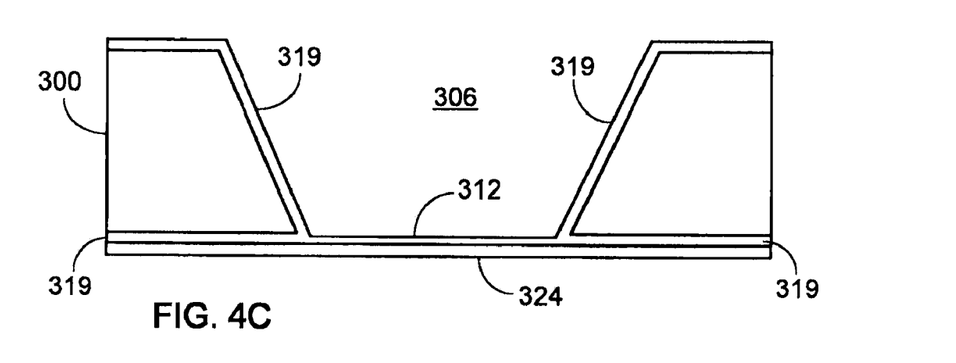
Figure 4D:
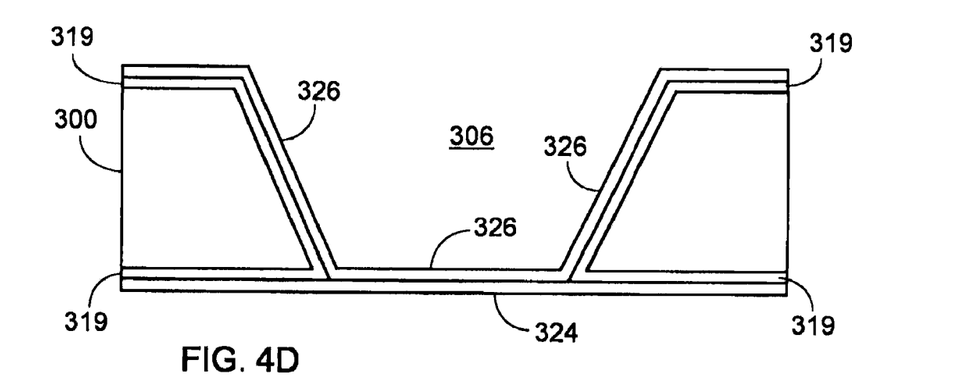

Following the thermal oxidation process, a relatively thin metal film 324 is deposited on one side of the wafer (e.g., the second side) as shown in FIG. 4C. The thin oxide membrane 312 then is removed, for example, by a HF etching process. The thicker regions of oxide 319 that were formed during the thermal oxidation process can remain and serve as isolation layers. A thin metal film 326 then is deposited over the first side of the wafer, as shown in FIG. 4D. The metal film 326 deposited over the first side of the wafer extends along the sides and bottom of the cavity 306.

Figure 4E:
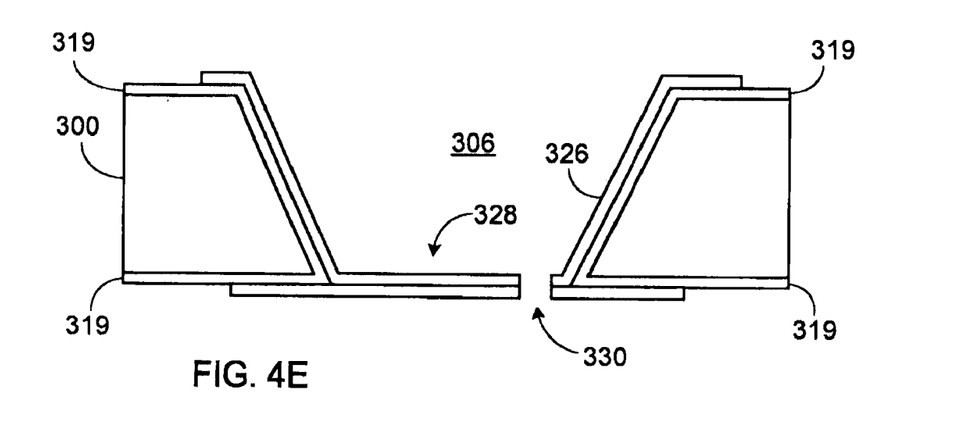

Next, as shown in FIG. 4E, the metallization 328 at the bottom of the cavity 306 can be patterned to form a cantilevered structure 328A, such as that in FIG. 5, or an inductor 328B, such as that in FIG. 6. Open gaps in the metallization pattern are identified by 330. The metallization 328 at the bottom of the cavity can be patterned, for example, using standard lithography and wet etch techniques. The metallization along the sides of the cavity 306 serves as conductive lines from the upper surface of the wafer to the cantilevered structure 328A or inductor 328B.

Figure 7A:
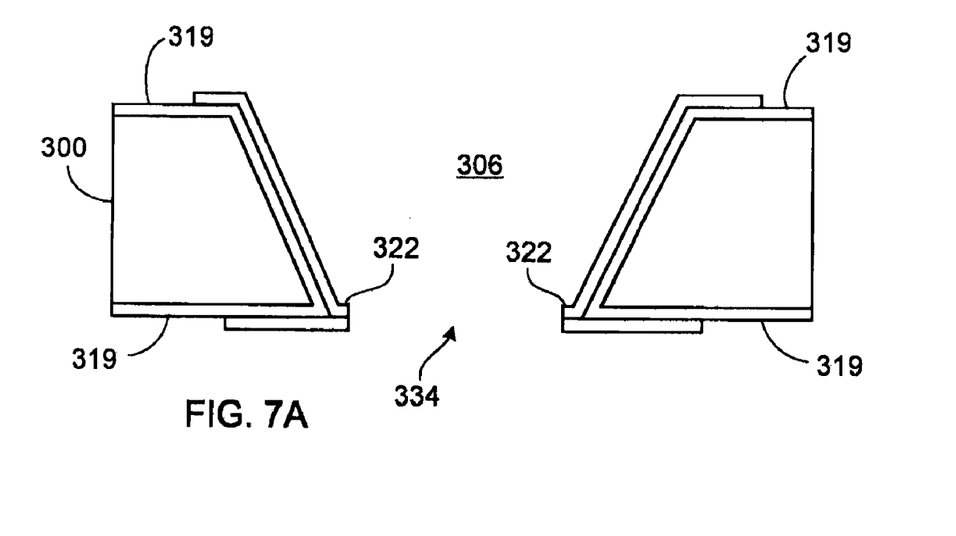
FIG. 7A illustrates an example of multiple electrical interconnections formed through a single opening in a semiconductor wafer.
Figure 7B:
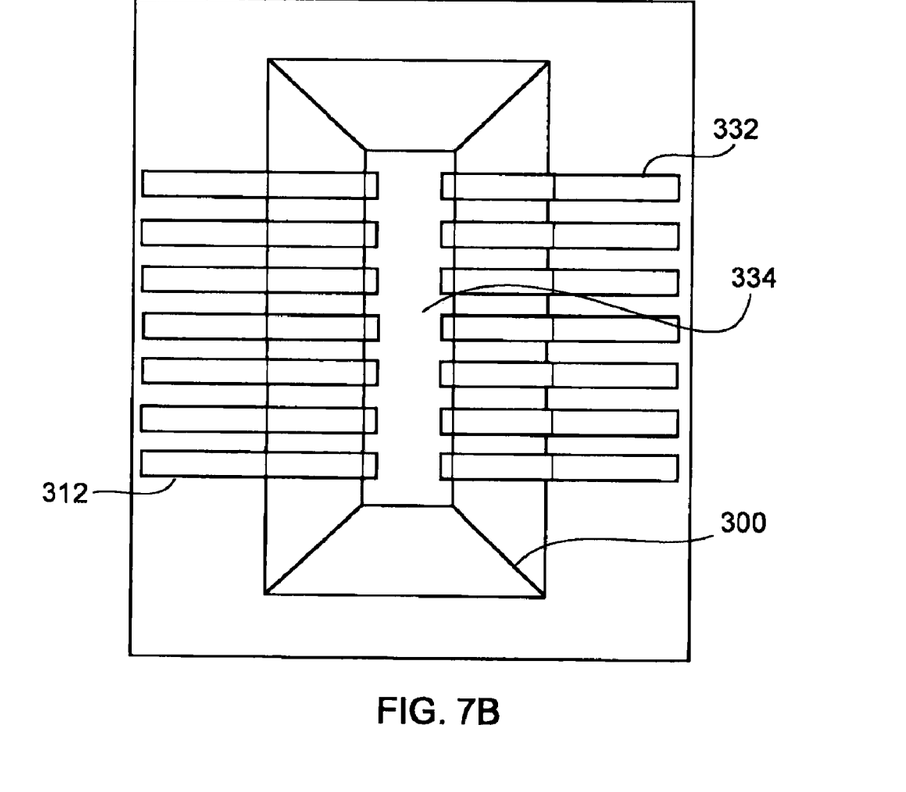
FIG. 7B illustrates a top view of the through-wafer interconnections of FIG. 7A.

The techniques of FIGS. 4A through 4D also can be used to form multiple electrical interconnections through a single non-hermetic via 334 in the semiconductor wafer. For example, after depositing the thin metal film 324 over the first side of the wafer, as shown in FIG. 4D, the metallization 324, 326 can be patterned to form through-wafer electrical interconnections 332, as shown in FIG. 7A. The metallization 324, 326 at the bottom of the cavity can be patterned, for example, using standard lithography and wet etch techniques. A top view of the via 334 and through-wafer interconnections 332 of FIG. 7A is shown in FIG. 7B.

Figure 8A:
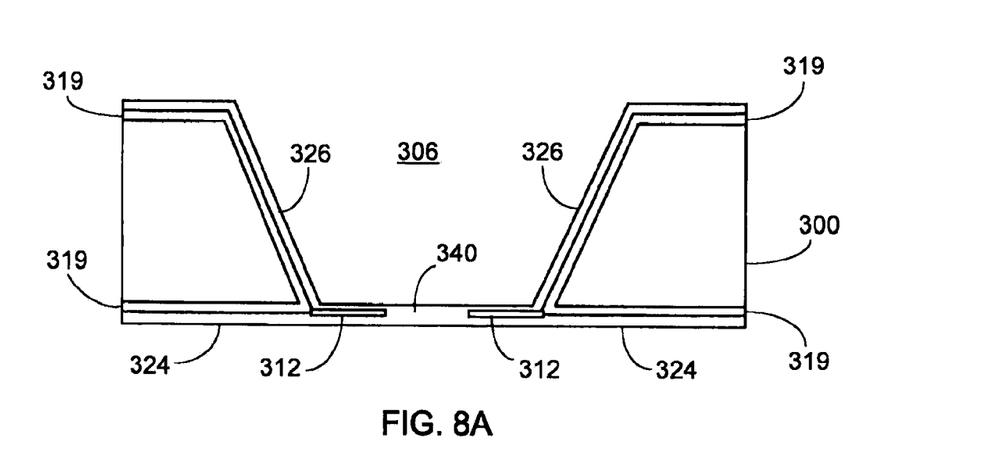
FIGS. 8A and 8B illustrate steps of a process for forming multiple electrical interconnections through a single hermetic via.
Figure 9A:
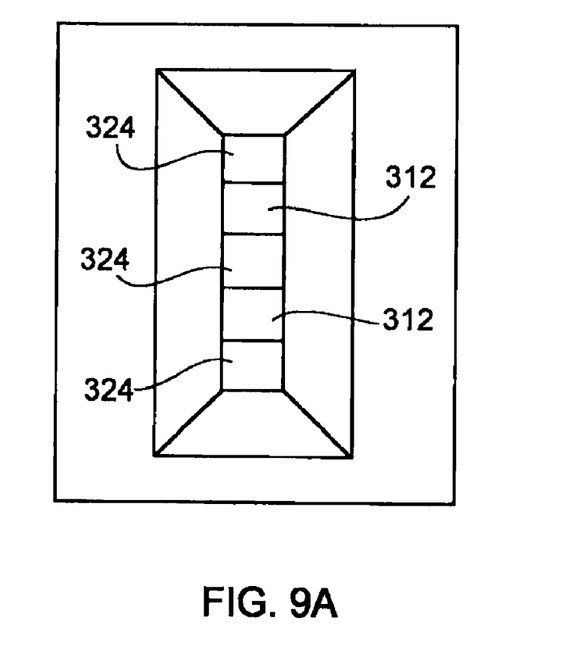
FIGS. 9A and 9B illustrate top views of the electrical interconnections associated with the process of FIGS. 8A and 8B.

The techniques of FIGS. 4A through 4C also can be used to form multiple electrical interconnections through a single hermetic via in the semiconductor wafer. After depositing the thin metal film 324 over one side of the wafer to cover the thin dielectric membrane 312, as illustrated in FIG. 4C, the thin dielectric membrane is etched selectively where the electrical interconnections are to be formed, and a thin metal film 326 is deposited over the first side of the wafer, as shown in FIG. 8A. The metallization 326 on the first side contacts the metallization 324 on the second side in the area where the dielectric membrane 312 was etched to form electrical interconnections 340 through a hermetic via. FIG. 9A is a top view of the semiconductor wafer after selectively etching the dielectric membrane 312, but before depositing the metal film 326. That figure shows the remaining portions of the selectively etched dielectric membrane 312 and exposed portions of the underlying metal film 324.

Figure 8B:
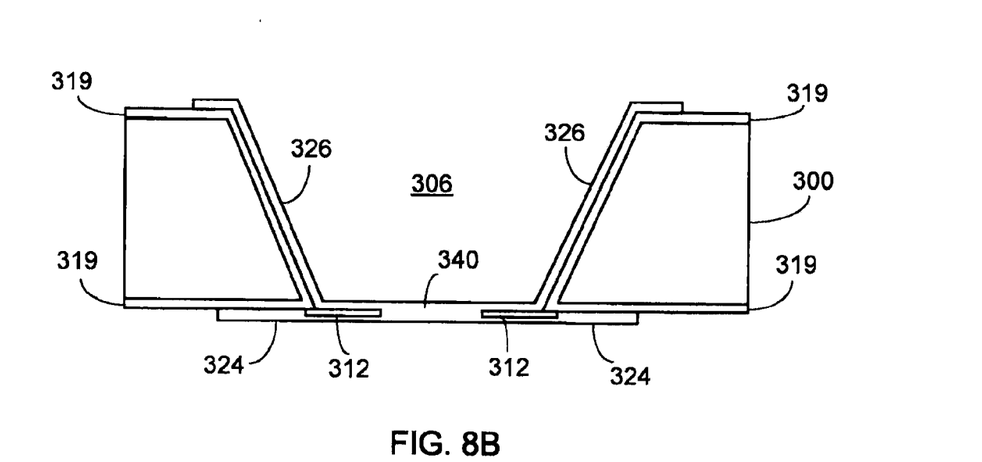
Figure 9B:
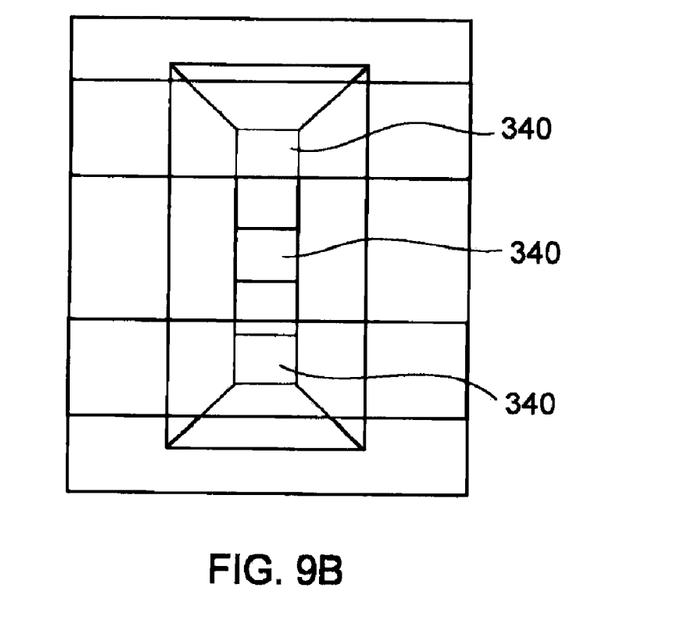

After depositing the thin metal film 326, the metallization 324, 326 is patterned using standard lithography and wet etch techniques, as shown in FIG. 8B and the top view of FIG. 9B. For example, the metal films 324, 326 can be etched from both sides of the wafer to define the separate electrical interconnections 340. The interconnections 340 are electrically isolated from one another.

Other implementations are within the scope of the claims.

What is claimed is:

1. A method of providing through-wafer interconnections in a semiconductor wafer having first and second sides, the method comprising:
   etching the first side of the wafer to form a cavity;
   providing an etch stop layer over the first side of the wafer, wherein the etch stop layer covers surfaces in the cavity;
   etching the second side of the wafer to form one or more micro-vias such that the one or more micro-vias reach the etch stop layer;
   depositing metallization over one of the first and second sides of the wafer;
   subsequently removing regions of the etch stop layer from areas corresponding to where the one or more micro-vias were formed; and
   depositing metallization over the other one of the first and second sides of the wafer so that the metallization deposited over the first side is in contact with the metallization deposited over the second side to form the through-wafer interconnections in areas corresponding to where the one or more micro-vias were formed.

2. The method of claim 1 wherein the semiconductor wafer comprises silicon, and the etch stop layer comprises at least one of silicon dioxide or silicon nitride.

3. The method of claim 1 wherein the semiconductor wafer comprises silicon, and wherein providing an etch stop layer includes thermally growing a silicon dioxide layer.

4. The method of claim 1 wherein a dimension of the cavity is larger than a corresponding dimension of each of the one or more micro-vias.

5. The method of claim 1 wherein the second side of the wafer is etched such that the one or more micro-vias reach a depth so as to expose thin membranes of the etch stop layer in the cavity.

6. The method of claim 1 including providing an isolation layer over surfaces of the semiconductor wafer prior to depositing metallization over the one side of the wafer.

7. The method of claim 1 including:
   selectively providing an oxide layer over the first and second sides of the wafer after forming the one or more micro-vias in the second side, such that portions of the etch stop layer remain exposed in the cavity, and wherein the thickness of the oxide layer is greater than the thickness of the etch stop layer; and
   wherein removing regions of the etch stop layer includes using an etchant that etches both the etch stop layer and the oxide layer.

8. The method of claim 7 including thermally growing the oxide layer.

9. The method of claim 7 wherein the oxide layer is at least three times as thick as the etch stop layer.

10. The method of claim 1 wherein the semiconductor wafer comprises silicon and wherein a dimension of the cavity is larger than a corresponding dimension of each of the one or more micro-vias,
   wherein the second side of the wafer is etched such that the one or more micro-vias reach a depth so as to expose thin membranes of the etch stop layer in the cavity, and
   wherein the method further includes selectively providing an oxide layer over the first and second sides of the wafer after forming the one or more micro-vias in the second side, such that portions of the etch stop layer remain exposed in the cavity and such that the thickness of the oxide layer is greater than the thickness of the etch stop layer.

11. The method of claim 10 including thermally growing the oxide layer.

* * * * *